United States Patent
Akita et al.

(10) Patent No.: US 6,268,582 B1
(45) Date of Patent: Jul. 31, 2001

(54) ECR PLASMA CVD APPARATUS

(75) Inventors: Noritaka Akita; Satoko Ishii, both of Hatano (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 09/502,488

(22) Filed: Feb. 11, 2000

(30) Foreign Application Priority Data

Feb. 24, 1999 (JP) .................................................. 11-045923
Dec. 28, 1999 (JP) .................................................. 11-375436

(51) Int. Cl.$^7$ .................................................. B23K 10/00
(52) U.S. Cl. .................................. 219/121.43; 219/121.4; 219/121.52; 156/345; 118/723 MW; 204/298.15
(58) Field of Search ........................... 219/121.43, 121.4, 219/121.41, 121.52; 156/345, 643.1, 646.1; 118/723 I, 723 MW, 724, 725, 723 R; 204/298.37, 298.38, 298.15

(56) References Cited

U.S. PATENT DOCUMENTS 5,476,182 * 12/1995 Ishizuka et al. .................. 156/643.1
5,976,327 * 11/1999 Tanaka ........................... 204/298.15
6,056,848 * 5/2000 Daviet .................................. 156/345

* cited by examiner

*Primary Examiner*—Mark Paschall
(74) *Attorney, Agent, or Firm*—Kanesaka & Takeuchi

(57) ABSTRACT

An ECR plasma CVD apparatus includes a cavity for producing an ECR plasma, a vacuum chamber connected to the cavity, a base plate holder for holding a base plate or substrate, an electrode plate, and a high frequency applying device for applying a high frequency current to the electrode plate. The electrode plate is disposed on a side opposite to the cavity with the base plate therebetween. The base plate is arranged parallel to the electrode plate with a predetermined space therebetween to generate an electrostatic coupling in the vacuum chamber. A high frequency current is applied to the electrode plate, so that the RF bias can be uniformly applied to the surface of a non-conductive base plate without contacting to thereby uniformly form a CVD membrane thereon.

5 Claims, 2 Drawing Sheets

ECR PLASMA CVD APPARATUS

BACKGROUND OF THE INVENTION AND RELATED ART STATEMENT

The invention relates to an electron cyclotron resonance plasma chemical vapor deposition apparatus (hereinafter referred to as ECR plasma CVD apparatus) suitable for forming a protective membrane or layer for, for example a magnetic disc of a hard disc recording apparatus.

It has been known that a fine and uniform protective membrane, i.e. film or layer, can be obtained through combined use of an ECR plasma CVD technique and an RF base plate bias system, and the technique has been used for forming a protective membrane in a post process in manufacturing a magnetic head. In case a magnetic disc for a hard disc recording device is formed of an aluminum disc, the RF base plate bias system is employed in the ECR plasma CVD apparatus in its post process, as well, so that a high quality protective membrane or layer can be formed. In this case, in order to form the membranes on both surfaces of a base plate or substrate at the same time regardless of a shape of a base plate holder, i.e. claws, it is suitable to adopt a system where a pulse-superposed DC bias is applied to the base plate.

However, in the conventional ECR plasma CVD apparatus having the bias application system, there has been a problem that the membrane can not be formed on a nonconductive glass base plate. In other words, in the recent magnetic disc market, since a higher density is required, glass is used as the base plate material. However, the glass base plate can not cope with this situation.

More specifically, since the glass base plate is nonconductive, DC bias can not be applied thereto. Further, in case of a base plate holder having a craw structure used for preventing damage or contamination which may occur on the base plate surface, since a bias distribution greatly depends on the claw structure of the base plate holder, a uniform membrane or layer is not obtained. Thus, the RF bias can not be employed either. It is considered that the bias need not be applied to the base plate at all, but the obtained membrane is not a fine membrane, so that it is not suitable as the protective membrane.

The present invention has been made in view of the above problems of the conventional ECR plasma CVD apparatus, and an object of the invention is to provide an ECR plasma CVD apparatus, wherein a uniform membrane can be formed on a non-conductive base plate or substrate, such as a glass base plate.

Further objects and advantages of the invention will be apparent from the following description of the invention.

SUMMARY OF THE INVENTION

To attain the above objects, an ECR plasma CVD apparatus of the invention is formed of a cavity having an electromagnetic coil therearound, into which a microwave is introduced, for producing ECR plasma; a vacuum chamber connected to the cavity for taking out the plasma therein from the cavity; a base plate holder for holding a base plate or substrate; an electrode plate disposed in the vacuum chamber on a side opposite to the cavity and arranged parallel to the base plate with a predetermined space therebetween; and a high frequency current applying device for applying a high frequency current to the electrode plate.

The base plate holder may be located in a state such that an electric potential is not applied to the base plate in the vacuum chamber.

The electrode plate is disposed on a back surface side of the base plate, i.e. on the side opposite to the cavity for producing the ECR plasma, parallel to the base plate with a predetermined space between the base plate and the electrode plate in the vacuum chamber. On the other hand, the base plate is held in a state where the electric potential is not applied in the vacuum chamber, i.e the base plate is electrically floated. Therefore, in case a high frequency current is applied to the electrode plate, the high frequency current is also applied to the base plate through an electrostatic coupling between the electrode plate and the base plate. Thus, a high frequency bias can be applied to the base plate without contacting.

On the other hand, the base plate holder may be connected to a resistance so that the base plate in the vacuum chamber is grounded through the resistance. In this case, the base plate in the vacuum chamber is held in a predetermined electric potential. Therefore, in case a high frequency current is applied to the electrode plate, the high frequency current is also applied to the base plate through an electrostatic coupling between the electrode plate and the base plate. Since the base plate holder is grounded through the resistance, ions entering into the base plate escape to the ground, so that the base is prevented from being charged up.

In the invention, since the electrode plate and the base plate are disposed parallel to each other with the predetermined space therebetween, uniform high frequency bias can be applied on the surface of the base plate to thereby form a uniform CVD membrane or layer on the surface of the base plate. Since the high frequency bias is applied to the base plate without contacting, the back surface of the base plate is not scratched or damaged. Therefore, when the back surface of the base plate is arranged to face the cavity and the CVD membrane forming is carried out, good CVD membranes can be obtained on both surfaces of the base plate.

DETAILED DESCRIPTION OF PREFERRED EMBODIMENTS

Figure 1:
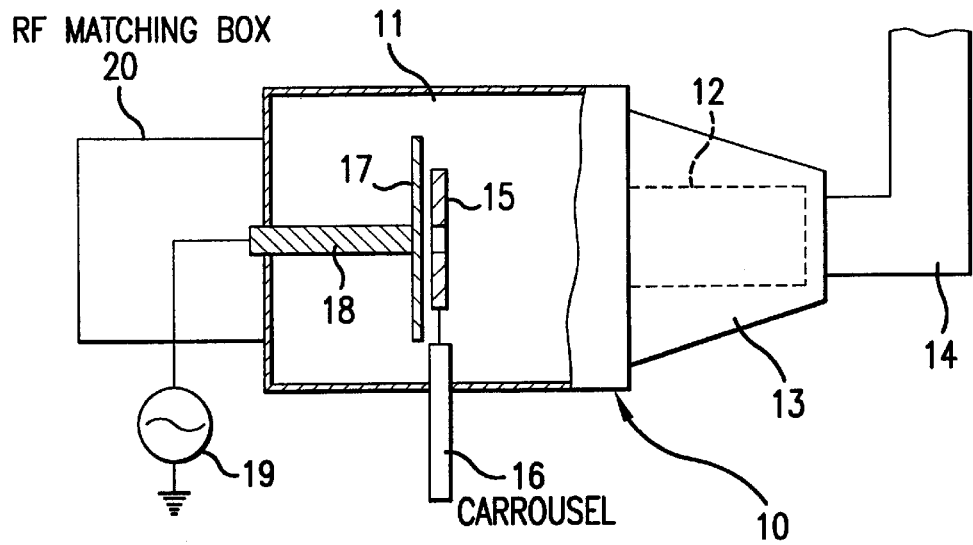
FIG. 1 is an explanatory diagram for showing a first embodiment of an ECR plasma CVD apparatus of the invention.

A first embodiment of the present invention is explained in detail with reference to FIGS. 1 and 2. As shown in FIG. 1, an ECR plasma CVD apparatus 10 of the invention includes a vacuum chamber 11 and a cavity 12 connected thereto. An electromagnetic coil 13 is disposed around an outer circumference of the cavity 12, and microwave of, for example, 2.45 GHz is introduced into the cavity 12 through a guiding pipe 14, so that plasma can be formed in the cavity 12 by an ECR discharge.

The plasma is taken out into the vacuum chamber 11 by a divergent magnetic field. In the vacuum chamber 11, a base plate or substrate 15 on which a protective membrane is to be formed is disposed in a state where an electric potential is not applied. In the present embodiment, the base plate 15 is a glass base plate to be used as a magnetic disc and held by a carrousel 16.

A conductive metallic electrode plate 17 is disposed in the vacuum chamber 11. The electrode plate 17 is located on a back surface side of the base plate 15, i.e. opposite side of the cavity 12, parallel to the base plate 15 with a predetermined space, for example in the order of 0.5 mm to 5 mm, therebetween. The surface of the electrode plate 17 is made rough. A conductive shaft 18 is attached to the electrode plate 17, and a high frequency current of, for example 13.56 MHz, is supplied to the electrode plate 17 through the conductive shaft 18 and an RF matching box 20 from a high frequency source 19. The RF matching box 20 is formed of an LC circuit to prevent a reflected wave by impedance matching.

In case a protective membrane or layer is formed on a surface of the base plate 15, i.e. on the side of the cavity 12, a hydrocarbon gas or a mixture of the hydrocarbon gas and an argon gas is introduced into the vacuum chamber 11 through a gas introducing system, not shown. Then, an ionization action takes place by the ECR plasma in the cavity 12 to thereby produce a positive carbon ion, hydrogen ion and hydrocarbon ion. The ions are taken out into the vacuum chamber 11 and directed toward the base plate 15 to adhere to the surface thereof. Thus, a carbon series DLC membrane, i.e. diamond-like membrane, is formed on the surface of the base plate 15. The DLC membrane is excellent in corrosion resistance and abrasion resistance, and is optimum as a protective membrane for the magnetic disc.

In the present embodiment, high frequency current is applied to the electrode plate 17, and the base plate 15 is electrically in a floating state. Also, an electrostatic coupling takes place between the base plate 15 and the electrode plate 17 disposed parallel to each other with a predetermined space therebetween. Thus, through the electrostatic coupling, the high frequency bias is applied to the base plate 15. Since the base plate 15 and the electrode plate 17 are disposed parallel to each other, the high frequency bias can be uniformly applied to the surface of the base plate 15. Therefore, a uniform DLC membrane can be extremely finely formed on the surface of the base plate 15.

Also, in the present embodiment, since a non-contact RF supply or charge can be carried out, there is no risk of making scratches on the back surface of the base plate 15. Thus, in case the CVD membrane is again formed on the other surface of the base plate by reversing the same, good DLC membranes can be formed on both surfaces of the base plate.

Although the surface of the electrode plate 17 is made rough as mentioned before, this is based on a maintenance view point. More specifically, although ions passing through a central hole of the disc base plate 15 adhere to the surface of the electrode plate 17, in case the surface of the electrode plate 17 is made rough, the membrane adhered thereto is hard to peel off. If the membrane adhered to the electrode plate 17 peels off, it becomes particles, which exerts bad influence on base plate 15. The bad influence can be removed by preventing the adhered membrane from peeling off.

Figure 2:
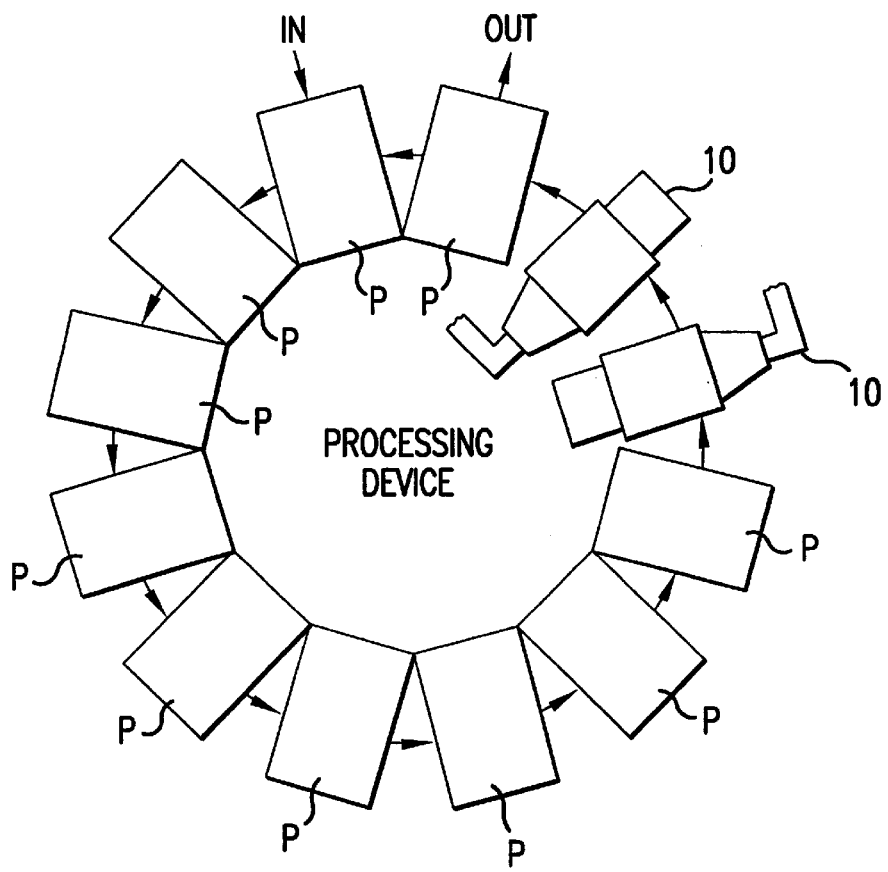
FIG. 2 is a conceptual diagram for showing a consecutive production system of a magnetic disc base plate using the ECR plasma CVD apparatus of the invention.

In case the magnetic disc base plate is consecutively produced, as shown in FIG. 2, a plurality of processing devices P, such as processing devices for heating and cooling and a sputtering device for forming the magnetic membranes, is arranged in a circle, and the glass base plate held by the carrousel is transferred to the respective stages or devices, sequentially. In the process near the end, two ECR plasma CVD apparatuses 10 are disposed in the directions opposite to each other to form the protective membranes on the disc base plate. In other words, instead of reversing the base plate, the base plate is sequentially transferred to the two ECR plasma CVD apparatuses 10 disposed in the directions opposite to each other, so that a membrane is formed on one side surface of the base plate at one time and finally the protective membranes are formed on both side surfaces of the base plate.

Figure 3:
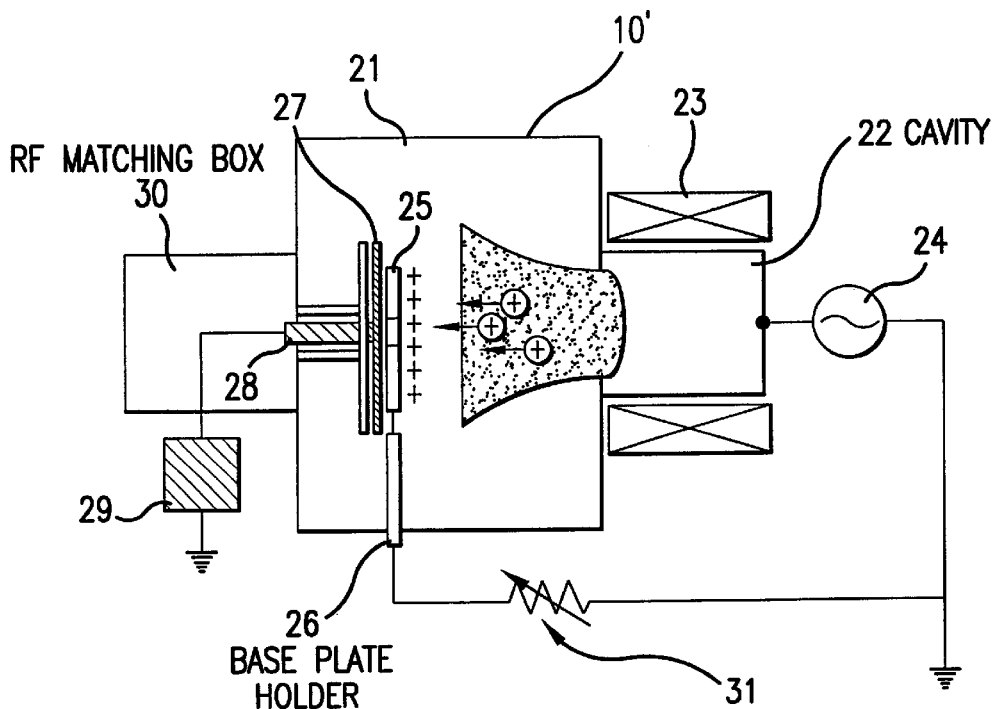
FIG. 3 is an explanatory diagram for showing a second embodiment the ECR plasma CVD apparatus of the invention.
Figure 4:
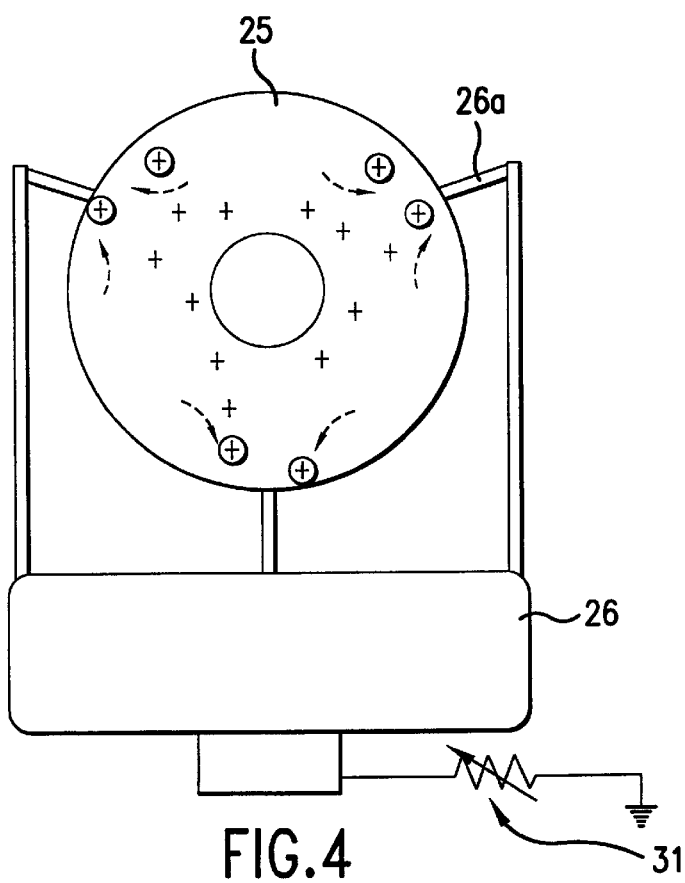
FIG. 4 is a diagram showing movements of electric charges on a base plate in case a base plate holder is connected to a resistance in the second embodiment.

Next, a second embodiment of the invention is explained with reference to FIGS. 3 and 4. An ECR plasma CVD apparatus 10' of the present embodiment includes a vacuum chamber 21 and a cavity 22 connected thereto. An electromagnetic coil 23 is disposed around an outer circumference of the cavity 22, and microwave of, for example, 2.45 GHz is introduced into the cavity 22 from a microwave generator 24, so that plasma can be formed in the cavity 22 by an ECR discharge.

The plasma is taken out into the vacuum chamber 21 by a divergent magnetic field. In the vacuum chamber 21, a base plate or substrate 25 on which a protective membrane is to be formed is disposed in a state where an electric potential is not applied. In the present embodiment, the base plate 25 is a glass base plate to be used as a magnetic disc and held by claws 26a of a base plate holder 26 having a conductivity. The base plate holder 26 is grounded through a variable resistance 31. Since the variable resistance 31 is provided, the base plate 25 and the base plate holder 26 are held at a desired electric potential, and at the same time, ions transferred to the base plate 25 are set free continuously to the ground to thereby prevent the base plate 25 from being charged up.

Incidentally, in case an optimum resistance value for applying a bias to the base plate 25 on which the membrane is formed is known beforehand, a fixed resistance may be used instead of a variable resistance 31; the base plate holder itself having a predetermined electric resistance value may be used; or a wiring to an earth point, having a predetermined electric resistance value, may be used. However, in the present embodiment, it is easy to change an electric resistance value as a parameter for adjusting a membrane quality by using the variable resistance.

In the apparatus 10', a conductive metallic electrode plate 27 is disposed in the vacuum chamber 21 through a conductive shaft 28, and a high frequency current of, for example, 13.56 MHz is supplied to the electrode plate 27 through an RF matching box 30 and the conductive shaft 28 from a high frequency source 29, similar to the apparatus 10. In case a protective membrane is formed on a surface of the base plate 25, a hydrocarbon gas or a mixture of the hydrocarbon gas and an argon gas is introduced into the vacuum chamber 21, and an ionization action takes place by the ECR plasma, so that a carbon series DLC membrane, i.e. diamond-like membrane is formed on the surface of the base plate 25, as in the apparatus 10.

In the embodiment, a high frequency current is applied to the electrode plate 27, and the base plate 25 is grounded through the base plate holder 26 and the variable resistance 31 to thereby hold a predetermined electric potential. Further, the base plate 25 and the electrode plate 27 are disposed parallel to each other with a predetermined space therebetween. Thus, an electrostatic coupling takes place. Through the electrostatic coupling, high frequency bias is applied to the base plate 15. Since the base plate 25 and the electrode plate 27 are disposed parallel to each other, the high frequency bias can be uniformly applied to the surface of the base plate 25. Therefore, a uniform LDC membrane can be extremely finely formed on the surface of the base plate 25.

In the embodiment, since the base plate holder 26 is electrically grounded, ions transferred into or accumulated in the base plate 25 are sequentially set free to the ground to thereby prevent the base plate 25 from being charged up. Thus, an arc discharge, which may take place between the base plate 25 and the base plate holder 26 when the base plate 25 is charged up, can be prevented. The rest of the structures, operations and advantages of the apparatus 10' is the same as those of the apparatus 10.

As described hereinabove, according to the ECR plasma CVD apparatus of the invention, the RF bias can be uniformly applied to the surface of the non-conductive base plate without contacting to thereby uniformly form a CVD membrane thereon. Also, since the base plate holder is grounded through a predetermined electric resistance, when a bias voltage necessary to form the membrane is applied, the electric potential required thereto is maintained, while the base plate is prevented from being charged up. Thus, the uniform membrane can be formed onto the non-conductive base plate or substrate, such as glass plate.

While the invention has been explained with reference to the specific embodiments of the invention, the explanation is illustrative and the invention is limited only by the appended claims.

What is claimed is:

1. An ECR plasma CVD apparatus comprising:
    a cavity for producing an ECR plasma having an electromagnetic coil therearound, microwave being introduced in said cavity;
    a vacuum chamber connected to the cavity to take out the plasma produced in the cavity;
    a base plate holder situated in the vacuum chamber adapted to hold a base plate;
    an electrode plate disposed near the base plate holder to face the cavity so that the base plate supported by the base plate holder is located between the electrode plate and the vacuum chamber, said electrode plate being parallel to the base plate with a predetermined space therebetween; and
    a high frequency current applying device connected to the electrode plate for applying a high frequency current to the base plate so that an RF bias can be applied to a surface of the base plate without contacting.

2. An ECR plasma CVD apparatus according to claim 1, wherein said base plate holder holds the base plate in a state where an electric potential is not applied in the vacuum chamber.

3. An ECR plasma CVD apparatus according to claim 1, further comprising a resistance connected to the base plate holder so that the base plate holder is grounded through the resistance.

4. An ECR plasma CVD apparatus according to claim 3, wherein said resistance is a variable resistance so that the base plate holder is maintained at a desired electric potential while allowing ions accumulated thereon to escape to the ground.

5. An ECR plasma CVD apparatus according to claim 1, wherein said high frequency current applying device further includes an RF matching device having an LC circuit to prevent a reflected wave by impedance matching.

* * * * *